US006792810B2

(12) United States Patent
Kupfernagel et al.

(10) Patent No.: US 6,792,810 B2
(45) Date of Patent: Sep. 21, 2004

(54) ULTRASONIC SENSOR

(75) Inventors: Uwe Kupfernagel, Freiberg (DE); Heinrich Gotzig, Heilbronn (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 0 days.

(21) Appl. No.: 10/286,782

(22) Filed: Nov. 4, 2002

(65) Prior Publication Data

US 2003/0089172 A1 May 15, 2003

(30) Foreign Application Priority Data

Nov. 9, 2001 (DE) ........................................ 101 56 259

(51) Int. Cl.[7] ............................................. H01L 41/053

(52) U.S. Cl. ......................................... 73/632; 310/334

(58) Field of Search ............................ 73/632; 310/334, 310/336; 367/163, 180, 188; 181/170, 174; 381/426, 432

(56) References Cited

U.S. PATENT DOCUMENTS

| | | | | | |
|---|---|---|---|---|---|
| 4,395,597 A | * | 7/1983 | Suzuki et al. | ............... | 181/170 |
| 4,536,673 A | * | 8/1985 | Forster | ........................ | 310/334 |
| 5,457,352 A | * | 10/1995 | Muller et al. | ............... | 310/334 |
| 6,587,564 B1 | * | 7/2003 | Cusson | ........................ | 381/67 |

* cited by examiner

*Primary Examiner*—John E. Chapman
(74) *Attorney, Agent, or Firm*—Paul Vincent

(57) ABSTRACT

The invention concerns an ultrasonic sensor with a pot-shaped diaphragm having an oscillatory diaphragm bottom and a diaphragm wall which surrounds at least sections of the diaphragm bottom. The invention is characterized in that at least sections of the diaphragm wall have a foam-like structure.

5 Claims, 2 Drawing Sheets

ULTRASONIC SENSOR

This application claims Paris Convention priority of DE 101 56 259.4 filed Nov. 9, 2001 the complete disclosure of which is hereby incorporated by reference.

BACKGROUND OF THE INVENTION

The invention concerns an ultrasonic sensor with a pot-shaped diaphragm which has an oscillatory diaphragm bottom and a diaphragm wall which surrounds at least sections of the diaphragm bottom. Ultrasonic sensors of this type are used e.g. for short-range detection systems in motor vehicles.

The invention also concerns a method for producing such an ultrasonic sensor.

Conventional ultrasonic sensors comprise decoupling media between the diaphragm and a housing which accommodates the diaphragm. The individual components of the ultrasonic sensor are produced separately and joined and fitted to each other. Positioning of the diaphragm is subject to undesired variations due to the tolerances in the components. Moreover, media are also required to decouple the vibration of the diaphragm from the housing.

It is the underlying purpose of the present invention to provide an ultrasonic sensor which permits exact positioning of the diaphragm and has a minimum number of components.

SUMMARY OF THE INVENTION

This object is achieved in accordance with the invention in an ultrasonic sensor of the above-described type in that at least sections of the diaphragm wall have a foam-like structure. Decoupling media between the diaphragm or diaphragm wall and an optional housing are not required. Since, during operation of the ultrasonic sensor, the diaphragm bottom is predominantly used for generating ultrasound, the diaphragm wall can have a foam-like structure which has a reduced oscillation capacity. A diaphragm wall of this type assumes the function of the conventional decoupling media. The inventive ultrasonic sensor does not require a separate decoupling media and the number of components is therefore reduced.

In accordance with the invention, the diaphragm bottom advantageously lacks a foam-like structure. This ensures that the diaphragm bottom maintains its oscillatory properties and can be used for generating ultrasound.

In another embodiment of the invention, at least sections of the diaphragm wall and the diaphragm bottom have a foam-like structure. The regions of the diaphragm bottom which are not used for generating ultrasound, may have reduced oscillatory properties. Such regions are required in particular when ultrasonic lobes of defined geometry are to be produced.

Another advantageous embodiment of the invention is characterized in that the diaphragm bottom has a defoamed structure. The diaphragm bottom may be initially foam-like and is then defoamed e.g. through compressing the foam-like section which is to form the diaphragm bottom.

The diaphragm bottom is advantageously made from the same material as the diaphragm wall. Instead of initial foaming and defoaming thereof, the diaphragm bottom can be made from a solid, non-foamed material.

In another embodiment of the invention, the diaphragm bottom is made from a different material than the diaphragm wall. The diaphragm bottom can be e.g. of a particularly suitable material, e.g. a metallic material. Independent thereof, the diaphragm wall is e.g. of a foamed material having a foam-like structure.

In a particularly preferred embodiment of the invention, the ultrasonic sensor has no housing. The outer diaphragm wall structure, which is preferably completely foamed, provides a mounting means to be disposed on a component. Such a component can be, in particular, the bumper of a vehicle. This embodiment of the invention is advantageous in that neither a separate decoupling medium nor an additional housing are required. The diaphragm wall which consists of the foam-like structure thereby constitutes both the decoupling medium as well as the housing. Due to the reduction in the number of components, the ultrasonic sensor can be precisely located at the predetermined position. There are no undesired errors which result from the various tolerances of the conventional, individual components. Contact may be point-like or linear for exact positioning of the ultrasonic sensor on the component.

The above-mentioned object is also achieved by a method for producing an inventive ultrasonic sensor which is characterized in that a base material is foamed to a volume piece and the volume piece forms at least sections of the diaphragm wall and/or the diaphragm bottom. Regions of the diaphragm which are not used for producing ultrasound consequently do not consist of solid material but of a foam-like structure with reduced oscillatory properties.

The volume piece can thereby be worked before use as the diaphragm wall and/or diaphragm bottom. Deep drawing of the volume piece has shown to be particularly advantageous. Deep drawing produces a pot-shaped diaphragm from a foamed, preferably cylindrical volume piece. The diaphragm wall is hardly impaired by the deep-drawing process. In contrast thereto, the diaphragm bottom is advantageously defoamed during deep drawing such that it can be used for producing ultrasound.

The foamed volume piece and/or the deep-drawn volume piece can also preferably be machined. Lathe turning and milling of the foamed volume piece have been shown to be advantageous.

In a preferred method, foaming is carried out in a foaming mold. Foaming of the volume piece can thereby be controlled. In the ideal case, post processing is unnecessary.

Advantageously, the foaming mold has inner dimensions which correspond to the outer dimensions of the diaphragm. This is advantageous in that highly precise outer dimensions of the diaphragm can be realized without requiring post processing of the outer surfaces. Tolerances can be kept with great precision.

To produce an inventive diaphragm, the diaphragm bottom can be formed by an inserted, non-foamed material. A diaphragm bottom of this type can be e.g. of a metallic material. The diaphragm wall is preferably foamed to the diaphragm bottom to provide rigid connection therewith. This is advantageous in that no additional means for mounting the diaphragm bottom to the diaphragm wall are required.

Further advantageous embodiments and details of the invention can be extracted from the following description which shows and explains the invention in more detail by means of the embodiment shown in the drawing.

DESCRIPTION OF THE PREFERRED EMBODIMENT

Figure 1:
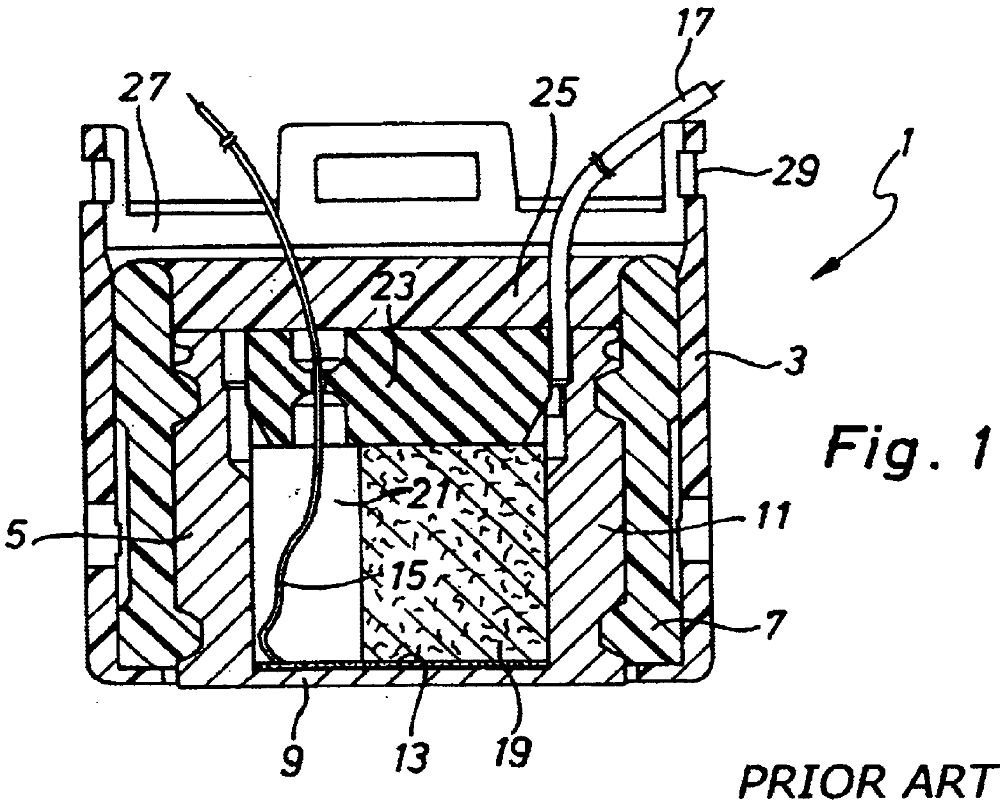
Fig. 1 PRIOR ART
FIG. 1 shows a longitudinal section through an ultrasonic sensor in accordance with prior art.

FIG. 1 shows a conventional ultrasonic sensor 1. The ultrasonic sensor 1 comprises a plastic housing 3 and a pot-shaped diaphragm 5 of aluminum, wherein a rubber-like annular decoupling medium 7 is provided between the housing 3 and the diaphragm 5.

The diaphragm 5 consists of a diaphragm bottom 9 which is surrounded by a diaphragm wall 11. A piezo ceramic plate 13 is disposed on the inside of the diaphragm bottom 9. An electric voltage can be applied to the piezo ceramic plate 13 via an electric line 15 which terminates on the piezo ceramic plate 13 and a further electric line 17 which is wedged laterally on the inside of the diaphragm 5.

The diaphragm 5 is filled with a mechanical damping material 19. The damping material 19 has an opening 21 in the region where the electric line 15 extends to the piezo ceramic plate 13. A rubber part 23 is provided in the inner upper region of the diaphragm 5 to position the damping material 19.

An upper opening in the diaphragm 5 is sealed by a silicone sealing compound 25. The upper opening in the housing 3 is sealed by a housing lid 27. The housing can be disposed on a component, e.g. a bumper of a vehicle, via mounting means 29.

Figure 2:
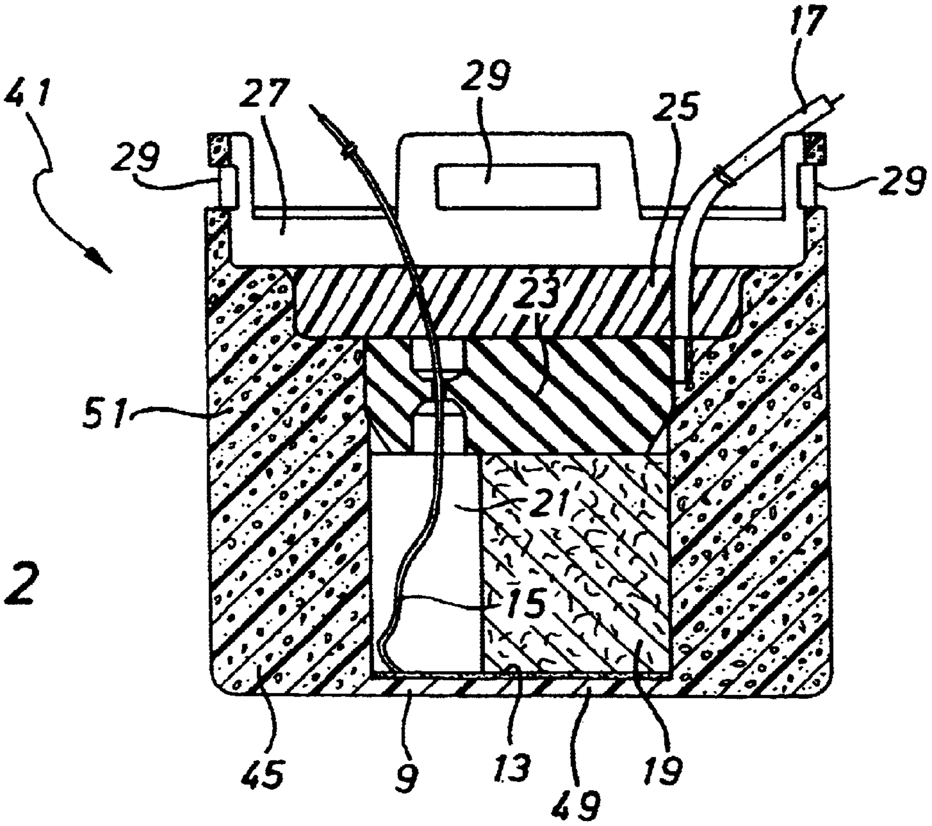
FIG. 2 shows a longitudinal section through a first embodiment of an inventive ultrasonic senor.

In contrast to the conventional ultrasonic sensor 1, the inventive ultrasonic sensor 41 in accordance with the first embodiment of FIG. 2 has a diaphragm 45 which has a diaphragm wall 51 of a foam-like structure. The diaphragm wall 51 thereby assumes the function of the diaphragm wall 11, the decoupling medium 7 and the housing 3 of an ultrasonic transducer 1 in accordance with FIG. 1.

The components in FIG. 2 which correspond to those of FIG. 1 have the same reference numerals. The diaphragm bottom 49 of the diaphragm 45 is not foam-like but has a defoamed structure. A defoamed structure of this type can be oscillated by a piezo-ceramic plate 13 (see FIG. 1).

The ultrasonic sensor 41 of FIG. 2 has the decisive advantage compared to the conventional ultrasonic sensor 1 of FIG. 1 of having fewer components. The regions of the diaphragm 45 which are not used for oscillation but for generation of ultrasound have a foamed structure and therefore display oscillation-damped behavior.

To produce an ultrasonic transducer 41 in accordance with FIG. 2, a volume piece is advantageously foamed from a base material which has the outer dimensions of the diaphragm 45. This foaming can advantageously be effected in a foaming mold having inner dimensions which correspond to the outer dimensions of the diaphragm 45. To produce the diaphragm bottom 49, the preferably cylindrical volume piece can be deep-drawn to produce the pot-shaped diaphragm 51. The diaphragm bottom 49 is produced through compression of the part of the volume piece which, in a vertical cut, lies above the inner surface of the diaphragm bottom 49. The material of the diaphragm bottom 49 is consequently defoamed through the deep-drawing process. Through this defoaming, the diaphragm bottom 49 has sufficient oscillatory behavior to produce ultrasound.

The diaphragm 45 can also be machined, in particular turned down on the lathe or milled.

In an embodiment of the invention which is not shown, the diaphragm bottom can be of a preferably metallic material. To produce such an ultrasonic sensor, the diaphragm wall can be foamed directly on the diaphragm bottom. The diaphragm produced thereby has a diaphragm wall with a foam-like structure and a diaphragm bottom without foam-like, preferably metallic structure. The diaphragm wall and the diaphragm bottom of such a diaphragm are consequently of different materials.

The ultrasonic sensor 41 shown in FIG. 2 can be disposed directly on a component, e.g. a bumper of a vehicle, i.e. without providing an extra housing. The use of a diaphragm wall of foamed material ensures sufficient decoupling. Contact between the outside of the diaphragm 45 and e.g. a bumper can advantageously be point-like or linear.

FIG. 2 shows the mounting means 29 disposed on the outside of the diaphragm wall 51 for mounting to a component.

Figure 3:
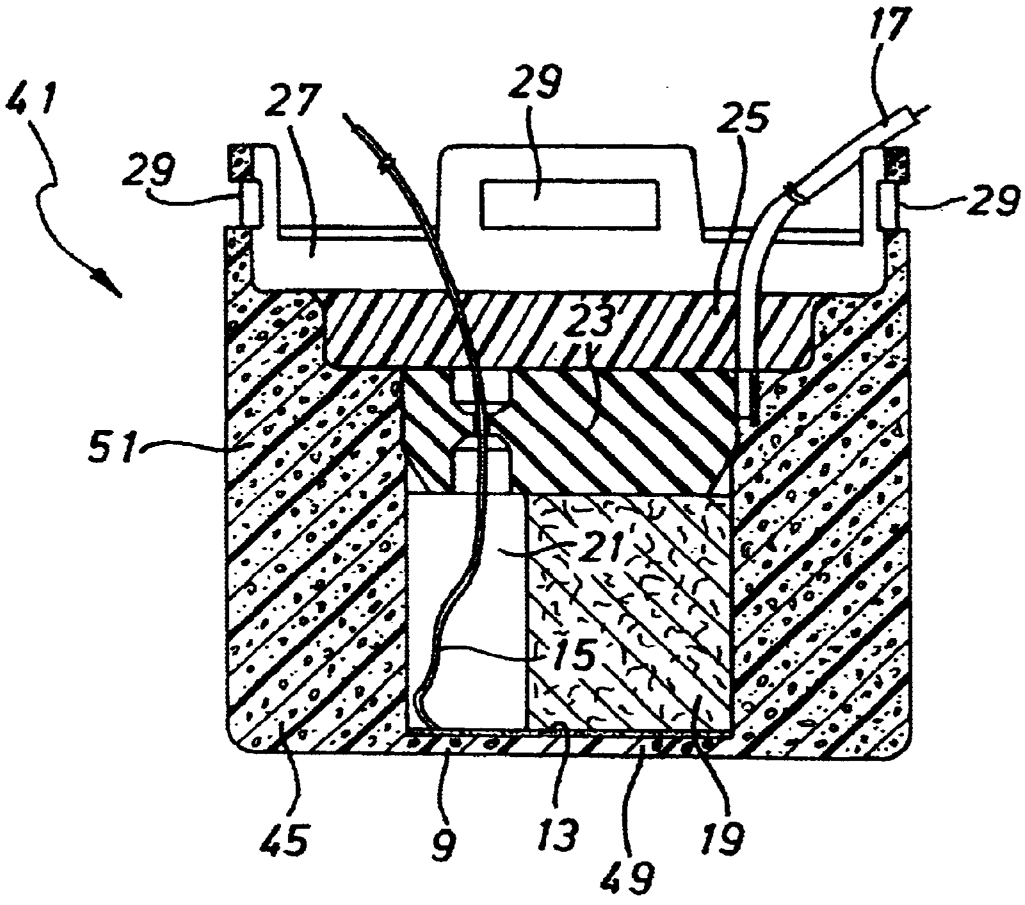
FIG. 3 shows a longitudinal section through a second embodiment of an inventive ultrasonic sensor.

FIG. 3 shows a longitudinal section through a second embodiment of the inventive ultrasound sensor in which portions of the diaphragm bottom 9 have a foamed structure.

All the features shown in the description, the subsequent claims and the drawing may be essential to the invention individually and also collectively in any arbitrary combination.

We claim:

1. An ultrasonic sensor comprising:

a pot-shaped diaphragm having an oscillatory diaphragm bottom for sensing ultrasound and a diaphragm wall which surrounds at least sections of said diaphragm bottom, wherein portions of said diaphragm wall have a foam-like structure and portions of said diaphragm bottom have a defoamed structure.

2. The ultrasonic sensor of claim 1, wherein at least portions of said diaphragm bottom have a foam-like structure.

3. The ultrasonic sensor of claim 1, wherein said diaphragm bottom consists essentially of a same material as said diaphragm wall.

4. The ultrasonic sensor of claim 1, further comprising means, disposed on an outside of said diaphragm wall, for mounting the sensor to a host component.

5. The ultrasonic sensor of claim 4, wherein said host component is a bumper of a vehicle.

* * * * *